United States Patent
Kawagishi et al.

(10) Patent No.: US 7,535,940 B2
(45) Date of Patent: May 19, 2009

(54) OPTICAL TRANSMITTER

(75) Inventors: Toru Kawagishi, Kanagawa (JP);
Moriyasu Ichino, Kanagawa (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 405 days.

(21) Appl. No.: 11/270,448

(22) Filed: Nov. 10, 2005

(65) Prior Publication Data
US 2006/0120413 A1 Jun. 8, 2006

(30) Foreign Application Priority Data
Nov. 11, 2004 (JP) .................... P. 2004-327904

(51) Int. Cl.
*H01S 3/04* (2006.01)

(52) U.S. Cl. .................... 372/34; 372/36; 372/38.09

(58) Field of Classification Search ............ 372/31, 372/32, 34, 36, 38.09, 38.02, 38.1
See application file for complete search history.

(56) References Cited

U.S. PATENT DOCUMENTS

| | | | |
|---|---|---|---|
| 5,267,252 A * | 11/1993 | Amano | .................... 372/34 |
| 5,978,395 A | 11/1999 | Nomura | |
| 6,681,133 B2 * | 1/2004 | Chaiken et al. | ............. 600/473 |
| 2004/0179778 A1 * | 9/2004 | Hayashi | .................... 385/34 |
| 2006/0182159 A1 * | 8/2006 | Fairgrieve et al. | ........ 372/38.02 |

FOREIGN PATENT DOCUMENTS

| | | |
|---|---|---|
| JP | 09-191293 A | 7/1997 |
| JP | 2003-298524 | 10/2003 |

* cited by examiner

*Primary Examiner*—Minsun Harvey
*Assistant Examiner*—Tod T Van Roy
(74) *Attorney, Agent, or Firm*—Venable LLP; Michael A. Sartori; Steven J. Schwarz

(57) ABSTRACT

The present invention provides an optical transmitter that prevent the overshoot and undershoot appeared in the emission wavelength caused by the fluctuation of the temperature of the laser diode installed therein. The optical transmitter includes a TEC driver, and a master controller. The TEC driver, by comparing the monitored temperature with the target temperature, outputs the error signal to the master controller, which enables the LD-Driver only when the error signal continuously stays within a convergent range by a preset period.

2 Claims, 7 Drawing Sheets

OPTICAL TRANSMITTER

BACKGROUND OF THE INVENTION

1. Field of the Invention

The present invention relates to an optical transmitter, in particular, the invention relates to the optical transmitter with a function to prevent the overshooting and the undershooting in an optical output at the beginning of the feedback operation.

2. Related Prior Art

The United States patent, U.S. Pat. No. 5,978,395, has disclosed an optical transmitter for the wavelength division multiplex (WDM) optical communication. The driver circuit disclosed in this patent provides a temperature control circuit to set the temperature of the laser diode (hereinafter denoted as LD) to a value where the LD emits light with a prescribed wavelength. This feedback circuit for stabilizing the temperature of the LD utilizes an error signal, difference between the practical temperature monitored by a temperature sensor and a target temperature for the LD to emit light with the prescribed wavelength. The LD-driver in this prior art shuts off the LD when, by using the error signal, the-monitored temperature of the LD is off the target temperature. Therefore, this optical transmitter prevents to emit light when, for example just after the power-on, the temperature of the LD fluctuates.

Another Japanese patent application published as 2003-298524 has disclosed an optical source capable of stabilizing the emission wavelength. The optical source of this prior art controls in feedback the temperature of the light emitting device to be a temperature corresponding to the prescribed emission wavelength. When the optical source is powered on, the LD is shut off by the specific circuit. The control of the temperature by the feedback loop starts as the LD is kept to be shut off. After stabilizing the temperature in the target temperature, the specific circuit is disabled to operate the LD. This optical source may prevent the cross talk to the neighbor channel at the beginning of the operation for the LD.

However, the feedback control of the temperature to set the temperature of the LD to be a preset value occasionally brings an overshoot or an undershoot in the temperature of the LD, equivalently in the emission wavelength thereof, because of the high closed loop gain of the feedback control and a large time constant of elements within the loop, such as a thermoelectric controller. In the transient response using the feedback loop, the temperature of the LD finally converges in a range around the predetermined value as oscillating over this convergent range, or iterating the overshoot and the undershoot with relaxing the magnitude thereof. Therefore, when the LD is turned on under the condition that the temperature thereof is within the convergent range around the target temperature, the emission wavelength occasionally becomes out of the acceptable shift from the target value.

The present invention, carried out in the light of the above subjects, provides an optical transmitter that prevents the overshoot and undershoot in the emission wavelength exceeding the acceptable range at the transmitted being powered on.

SUMMARY OF THE INVENTION

One aspect of the present invention relates to a configuration of the optical transmitter that comprises of the laser diode (LD), the laser driver (LD Driver), the thermoelectric controller (TEC), the TEC driver, and the master controller. The TEC driver compares the temperature of the laser diode, which is monitored by a temperature sensor disposed close to the LD, with a target temperature set outside of the transmitter, and outputs an error signal, which corresponds to a difference between the monitored temperature and the target temperature, to the master controller. The master controller, by monitoring whether the error signal continuously stays within a convergent range or not, and generates a driver enable signal and sends it to the laser driver when a period for the error signal to stay within the convergent range in continuous exceeds a preset period.

The master controller may include a counter, a counter controller, and a driver controller. The counter controller enables, by receiving the error signal, the count enable signal when the error signal is within the convergent range and the count reset signal when the error signal is out of the convergent range. The counter counts a clock and generates a count signal when the count enable signal from the counter controller is enabled and generates, while is reset when the count reset signal also from the counter controller is enabled. The driver controller comparing the count signal from the counter with the preset period, and outputs the driver enable signal to the laser driver. The laser driver, by responding the driver enable signal from the driver controller, drives the LD.

According to the configuration above, the preset optical transmitter may emit light after the overshoot or undershoot is disappeared by stabling the temperature of the LD, which suppresses the fluctuation in the emission wavelength of the LD just after the transmitter is powered on. The conventional temperature control for the laser diode using a feedback loop, due to the high loop gain and a large time constant for the element within the feedback loop, a large overshoot and undershoot occasionally occurs, which shifts the emission wavelength of the LD over an allowable range. According to the present optical transmitter, since the LD may be enabled after the temperature thereof is enough stable, the shift in the emission wavelength may can be escaped.

Another configuration of the optical transmitter according to the present invention provides a master controller configured to generate a driver enable signal when the error signal, corresponding to a difference between the present temperature of the LD and the target temperature, is within a first convergent range and a rate to change thereof is within a second convergent range.

The master controller in this configuration may include a range monitor and slope monitor in addition to the driver controller. The range monitor, by receiving the error signal output from the TEC driver, outputs a first signal to the driver controller when the error signal within the first convergent range. The slope monitor, also by receiving the error signal, outputs a second signal to the driver controller when the rate of change of the error signal is within in the second convergent range. The driver controller, by receiving the first and second signals, enables the driver enable signal, and finally, the driver can drive the LD to emit with the predetermined emission wavelength.

In this configuration, the LD emits light after the temperature thereof is enough stable. Accordingly, the emission wavelength of the LD does not fluctuate or shift exceeding the acceptable range even just after the optical transmitter is powered on.

Another aspect of the present invention relates to a method for controlling the optical transmitter that comprises the LD, the LD driver, the TEC, the TEC driver and the master controller. The process of the invention comprises steps of: (a) monitoring the temperature of the LD, (b) comparing this monitored temperature with a target temperature set by outside of the transmitter, (c) observing by the master controller whether the error signal, corresponding to a difference between the monitored temperature and the target temperature, is within a convergent range or not, and (d) enabling a driver enable signal when a period that the error signal continuously stays within the convergent range exceeds a preset period. The LD driver, by receiving the driver enable signal from the master controller, may drive the LD.

Another method of the invention includes steps (c') and (d') replacing the steps (c) and (d). The step (c') comprises to observe by the master controller whether the error signal is within a first convergent range and, in the same time, whether a rate of change of the error signal is within a second convergent range or not. The step (d') comprises to enable the driver enable signal when both conditions that the error signal is within the first convergent range and the rate of change of the error signal is within the second convergent range are satisfied.

In these methods described above, the LD emits light after the temperature thereof is enough stable. Accordingly, the emission-wavelength of the LD does not fluctuate or shift exceeding the acceptable range even just after the optical transmitter is powered on.

DESCRIPTION OF PREFERRED EMBODIMENTS

The present invention may be understood by taking following specifications into consideration as referring to accompanying drawings disclosed as an exemplification. Next, preferred embodiments of the present invention will be described as referring to drawings. In the explanation below and the drawings, the same symbols or numerals will refer the same elements without overlapping explanations.

First Embodiment

Figure 1:
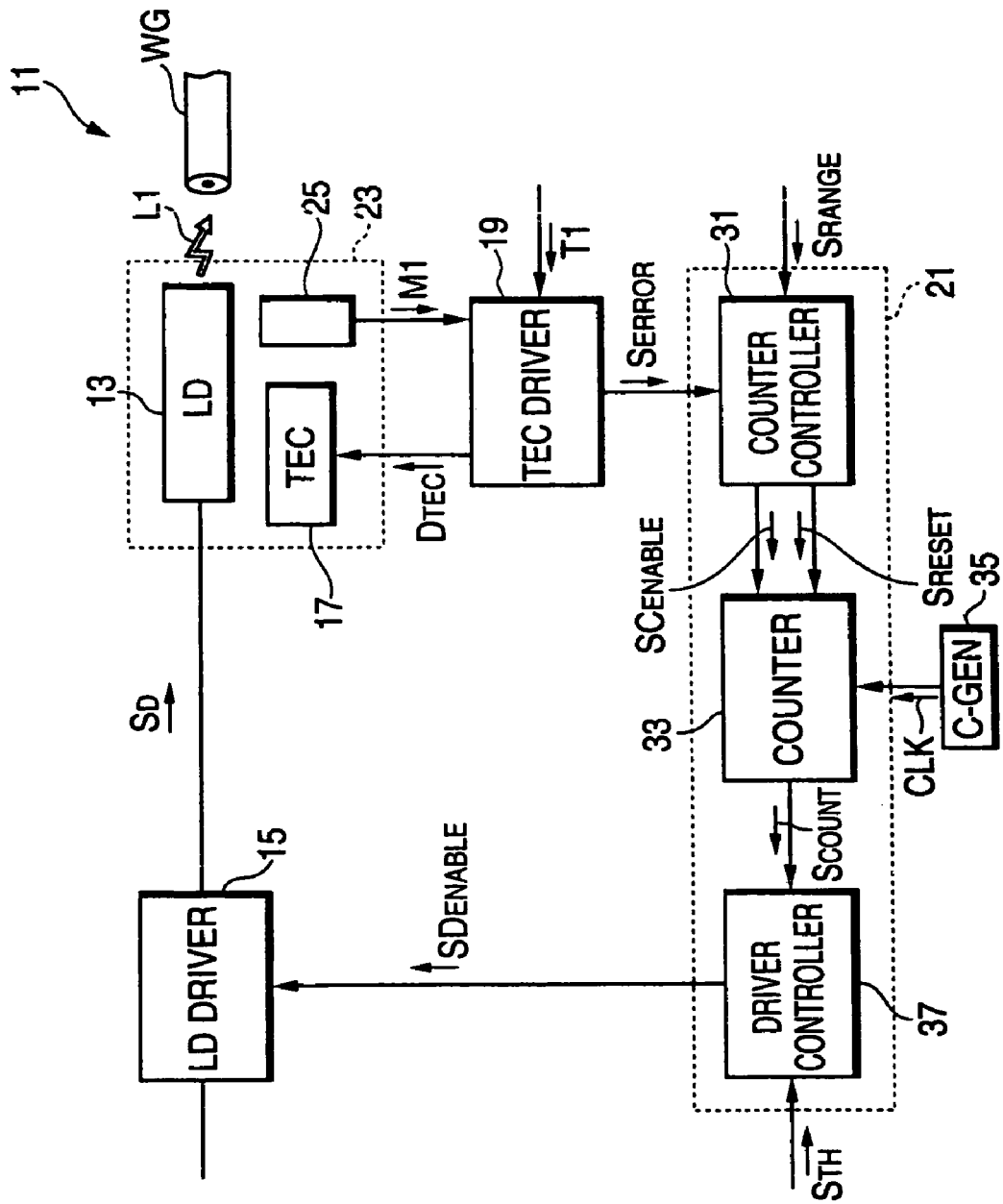
FIG. 1 is a block diagram of the optical transmitter according to the first embodiment of the invention.

FIG. 1 is a block diagram of an optical transmitter according to the first embodiment of the invention. The optical transmitter 11 comprises a laser diode (hereinafter denoted as LD) 13, an LD-Driver 15, a thermoelectric controller (TEC) 17, a TEC driver 19, and a master controller 21. The LD may be a type of Fabry-Perot LD, distributed feedback (DFB) LD, or vertical cavity surface emitting laser (VCSEL). The TEC 17 controls a temperature of the LD 13, and may use a Peltier element device. The LD-Driver 15 outputs a driving signal $S_D$ to the LD 13, and the LD 13, responding to this driving signal SD, emits signal light L1 that enters the optical fiber WG optically coupled with the LD 13.

The TEC driver 19 receives the temperature monitoring signal M1 and temperature setting signal T1 corresponding to the target temperature T1 of the LD 13. The controller 19 outputs, responding thus received temperature monitoring signal M1 and the temperature setting signal T1, the TEC control signal $D_{TEC}$ to the TEC 17, and an error signal $S_{ERROR}$ to the count controller 31.

The master controller 21, receiving the error signal $S_{ERROR}$ from the TEC driver 19, outputs an enable signal $SD_{ENABLE}$ to the LD-Driver 15, which enables the LD-Driver to output the driving signal $S_D$, when a period the error signal $S_{ERROR}$ is within a preset range exceeds a reference period $T_{REF}$. The LD-Driver 15, by receiving this enable signal $SD_{ENABLE}$, may output the driving signal $S_D$ to the LD 17. When the error signal $S_{ERROR}$ does not stay within the preset range in a predetermined period, the LD is forbidden in its operation. The temperature sensor 25 in the optical module 23 outputs the temperature monitoring signal M1 in an embodiment shown in FIG. 1. The temperature sensor 25 may be a thermistor.

The master controller 21 includes a counter controller 31, a counter 33, and a driver controller 37. The counter controller 31, by receiving the error signal $S_{ERROR}$ and a signal $S_{RANGE}$ denoting the preset range for the convergence of the temperature, outputs a count enable signal $SC_{ENABLE}$ to the counter 33. This count enable signal $SC_{ENABLE}$ is output only when the error signal $S_{ERROR}$ is smaller than the present range $S_{RANGE}$, that is, the error signal $S_{ERROR}$ is within the convergent range in the temperature. The counter controller 31 outputs a reset signal $S_{RESET}$ for the counter when the error signal $S_{ERROR}$ exceeds the range signal $S_{RANGE}$. Thus, the counter enable signal $SC_{ENABLE}$ and the counter reset signal $S_{RESET}$ are complementary to each other.

The counter 33 receives a clock CLK from the clock generator 35 in addition to the counter enable signal $SC_{ENABLE}$ and the counter reset signal $S_{RESET}$ from the counter controller 31. The counter 33, when receiving the count enable signal $SC_{ENABLE}$, counts the clock CLK and outputs the sum of the count to the driver controller 38 as a count signal $S_{COUNT}$. The counter 33, by responding to the counter reset signal $S_{RESET}$, may be reset.

The driver controller 37, by receiving a threshold signal $S_{TH}$ corresponding to a preset period $T_{REF}$ and the count signal $S_{COUNT}$ from the counter 33 and comparing both signals $S_{TH}$ and $S_{COUNT}$, outputs the driver enable signal $SD_{ENABLE}$ to the LD-Driver 15 when the count signal $S_{COUNT}$ exceeds the threshold signal $S_{TH}$, that is, the period when the error signal $S_{ERROR}$ stays within the present range $S_{RANGE}$ exceeds the preset period $T_{REF}$.

Figure 2:
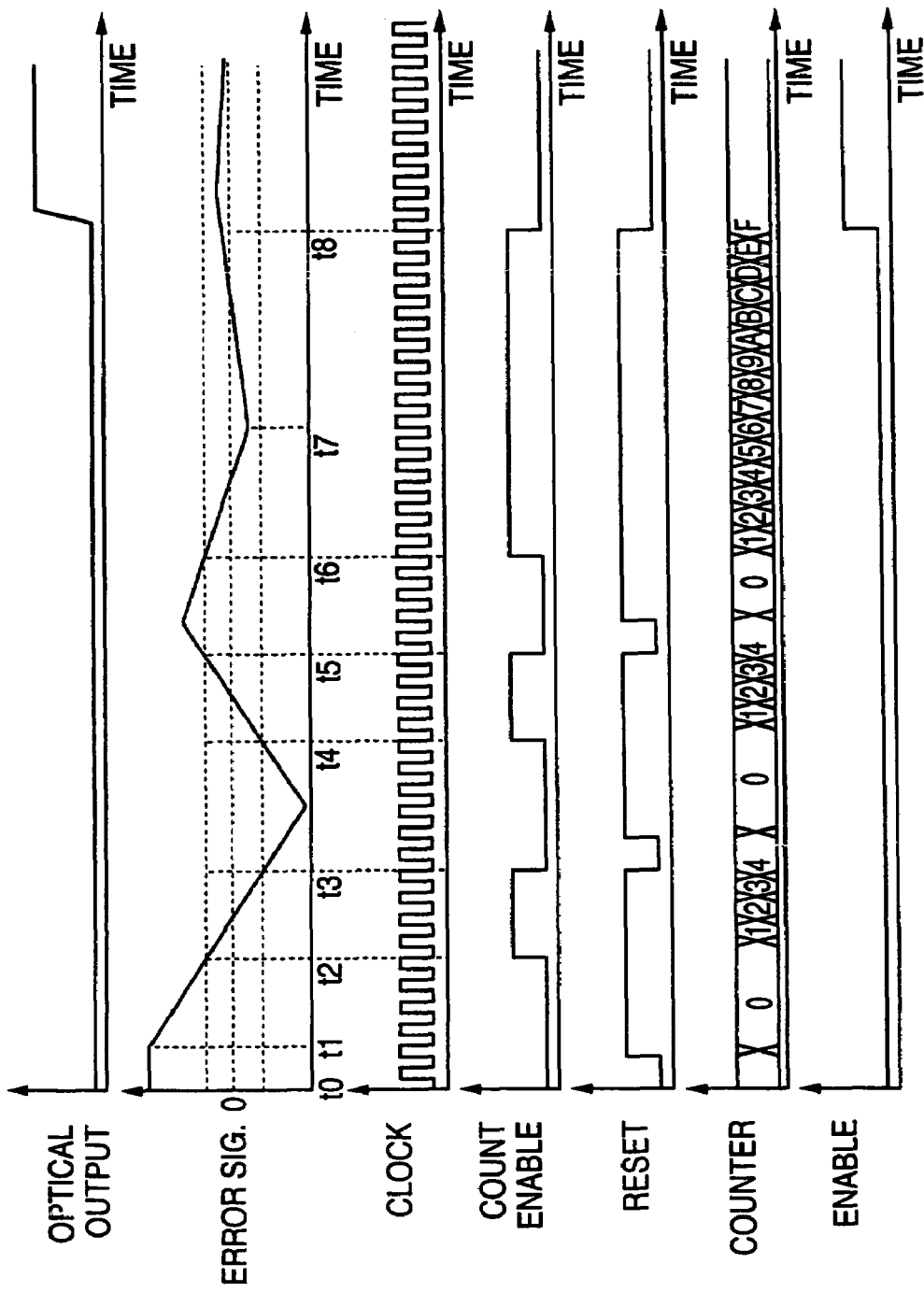
FIG. 2 is a time chart of the optical output, the error signal $S_{ERROR}$, the clock signal CLK, the count enable signal $SC_{ENABLE}$, the reset signal $S_{RESET}$, the operation of the counter, and the driver enable signal $SD_{ENABLE}$.

Next, the operation of the optical transmitter shown in FIG. 1 will be described as referring to FIG. 2. In FIG. 2, the optical output from the LD 13, the error signal $S_{ERROR}$, the clock CLK, the&count enable signal $SC_{ENABLE}$, the counter reset signal $S_{RESET}$, the operation of the counter, and the driver enable signal $SD_{ENABLE}$, are shown in time charts, respectively.

The optical transmitter 11 is powered on, or is reset at t0. FIG. 2 shows a case when the power-on-reset is applied and the reset $S_{RESET}$ is negated at t1. The counter controller 31 always compares the error signal $S_{ERROR}$ with the range signal $S_{RANGE}$ to determine the error signal $S_{ERROR}$ is in the convergent range in the temperature. The error signal $S_{ERROR}$ exceeds the upper limit of the range signal $S_{RANGE}$ since t1 through t2, and the driver enable signal $SD_{ENABLE}$ is disabled in this period. Varying the temperature of the LD 13 by the TEC driver 19, and the error signal $S_{ERROR}$ enters the convergent range, i.e., becomes below the upper limit of the range signal $S_{RANGE}$, the counter controller 31 outputs the count enable signal $SC_{ENABLE}$ to the counter 33, and the counter 33 starts to count the clock. The driver controller 37 compares the count signal $S_{COUNT}$ with the threshold signal $S_{TH}$ by, for example, after converting the count signal $S_{COUNT}$, which is a digital signal, into a corresponding analog signal by an A/D-converter.

In FIG. 2, after the counter 33 counts the clock CLK by 4, the error signal $S_{ERROR}$ becomes below the lower limit of the range signal $S_{RANGE}$, the counter controller 31 negates the count enable signal $SC_{ENABLE}$ to cease to count the clock CLK and resets the counter 23 by the reset signal $S_{RESET}$. Further varying the temperature of the LD 13, during which the LD 13 is left in the non-emitting condition, the error signal $S_{ERROR}$ enters within the converting range $S_{RANGE}$ again between t4 and t5. During this period, the operation is sequentially iterated that the counter enable signal $SC_{ENABLE}$ is output and the count of the clock CLK starts at the counter at t4, and the enable signal $SC_{ENABLE}$ is disabled and the count of the clock CLK stops at t5.

Moreover, when the error signal $S_{ERROR}$ enters within the convergent range again at t6 by setting the temperature of the LD 13 stable with the TEC driver 19, the counter controller 31 outputs the count enable signal $SC_{ENABLE}$, and the counter starts to count the clock CLK. Although the error signal $S_{ERROR}$ fluctuates at t7, the signal $S_{ERROR}$ still remains within the convergent range and the counter 33 continues to count the clock CLK. Since the count exceeds the preset number $T_{REF}$, the driver controller 37 outputs the driver enable signal $SD_{ENABLE}$ to the LD-Driver 15 at t8. The LD-Driver 15, responding to this enable signal $SD_{ENABLE}$, outputs the driving signal for the LD 13 and the LD 13 emits the signal light.

Figure 3:
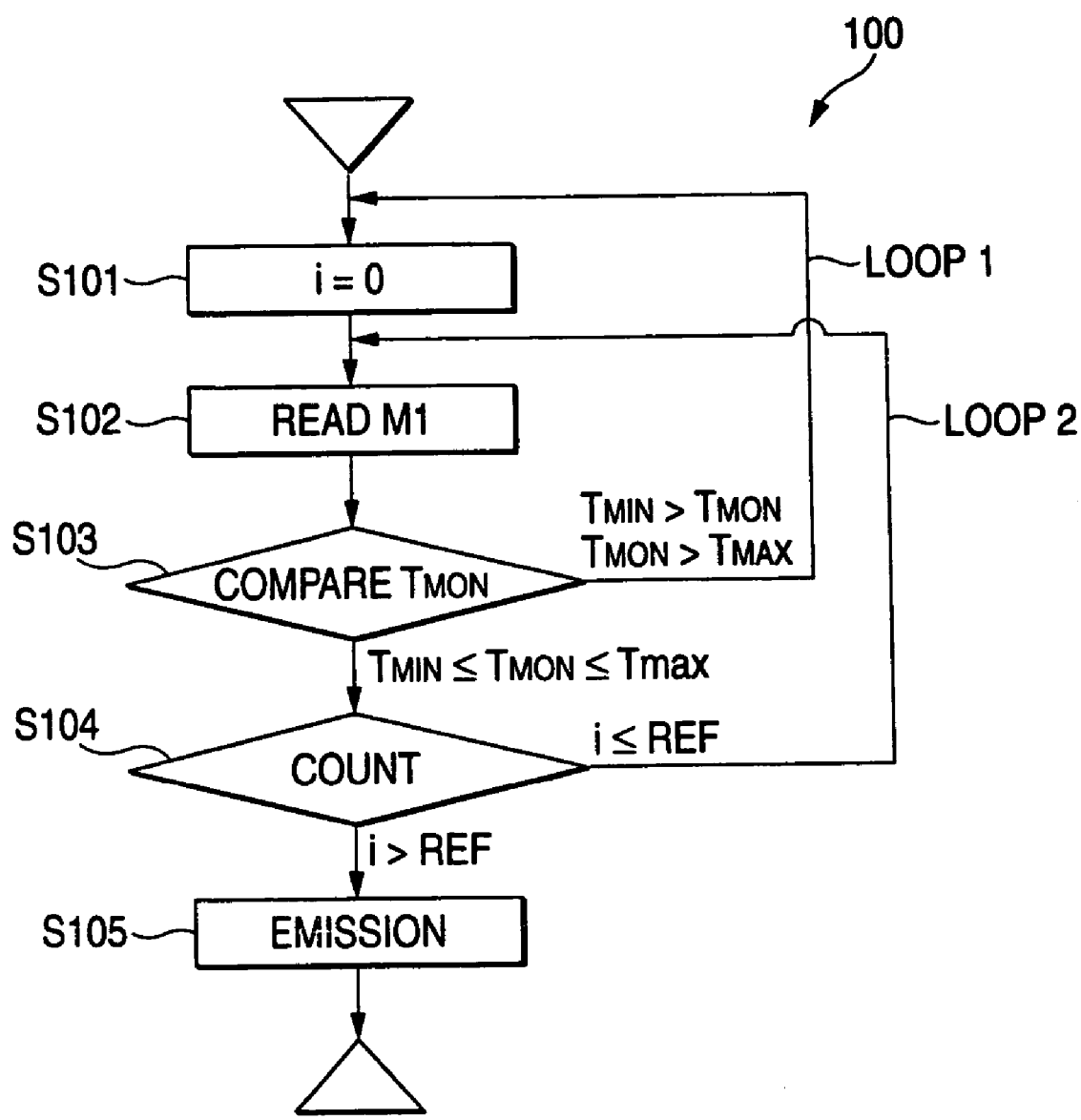
FIG. 3 is a flow chart showing the operation of the transmitter.
Figures 4A, 4B:
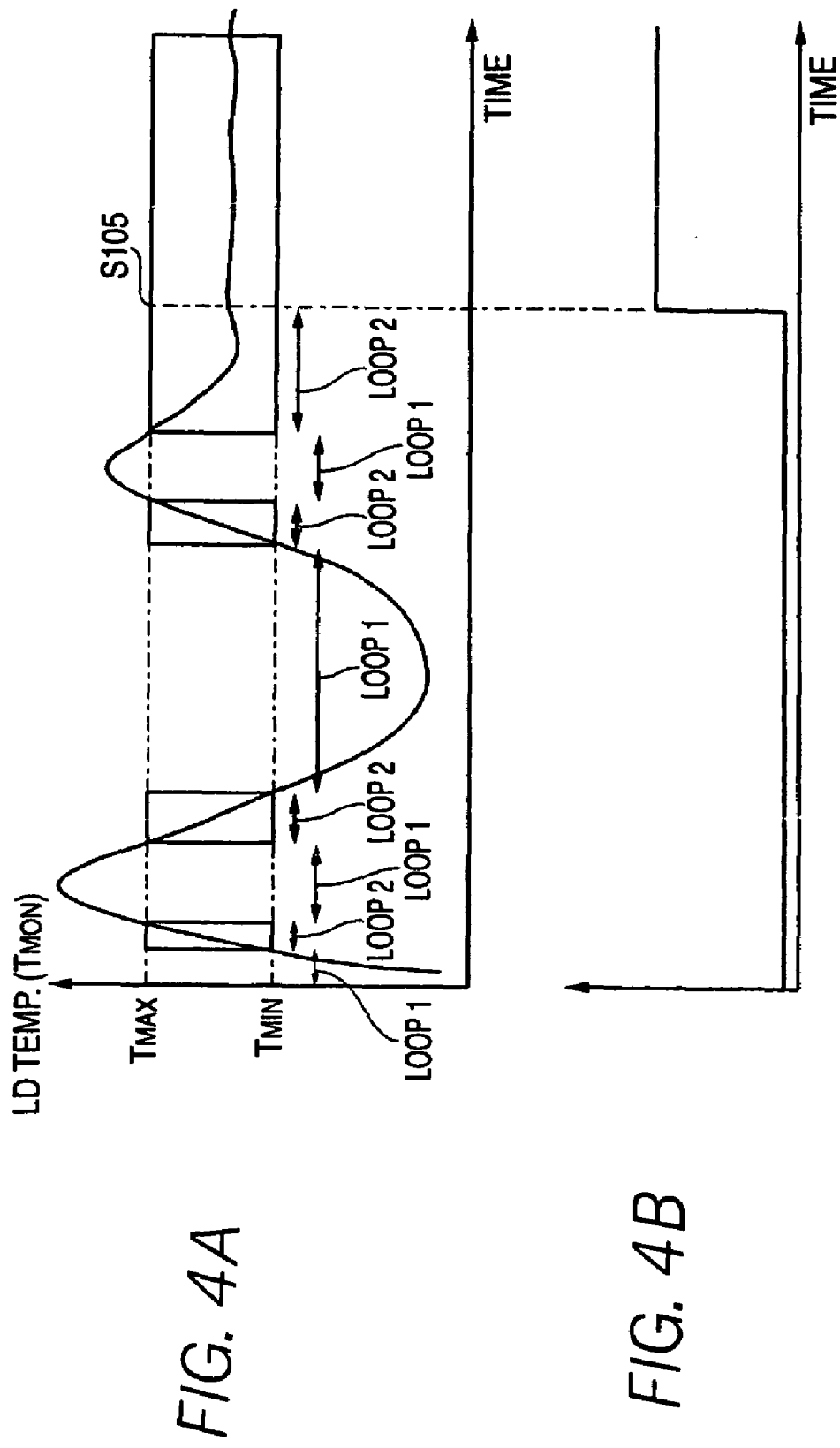
FIG. 4A shows the temperature monitoring signal.
FIG. 4B shows the driver enable signal $SD_{ENABLE}$.
Figure 5A:
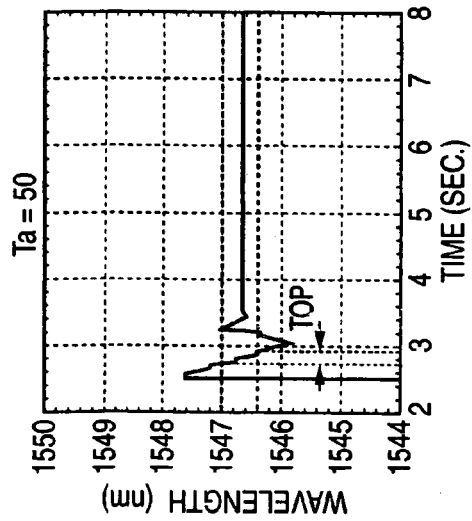
FIGS. 5A to 5D show the emission behavior of the optical transmitter operated in temperatures, −5° C., 40° C., 50° C., and 65° C., respectively.
Figure 5B:
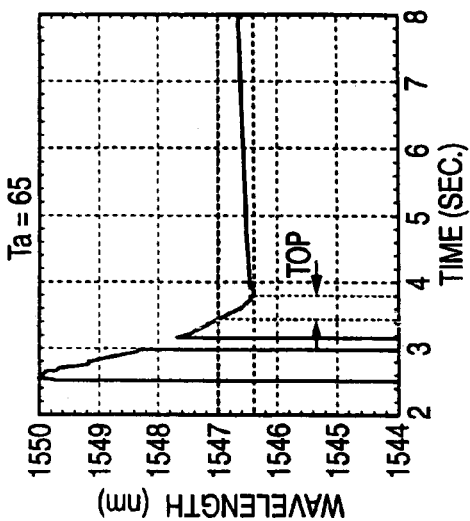
Figure 5C:
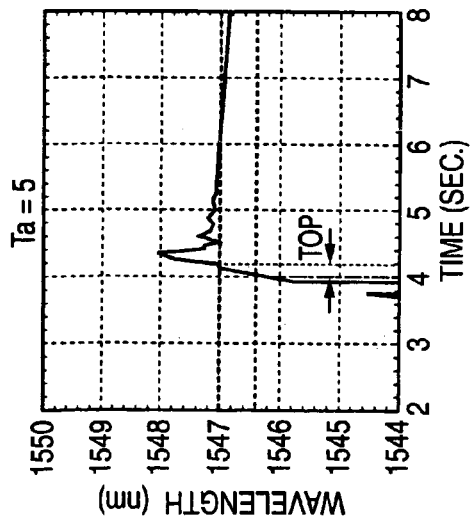
Figure 5D:
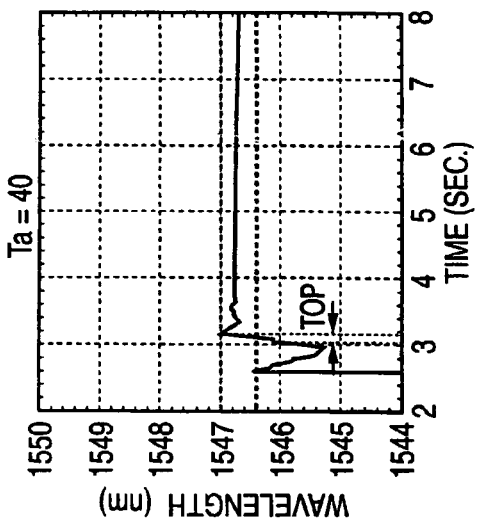

FIG. 3 illustrates a flow chart 100 of the operation described above, and FIG. 4A shows the temperature monitoring signal M1 and FIG. 4B denotes the driver enable signal $SD_{ENABLE}$, respectively.

After the optical transmitter is powered on, the counter is reset at step S101. Receiving the temperature monitoring signal M1 at step S102, the TEC driver 19 compares the temperature monitoring signal M1 with the target temperature T1 at step S103. The maximum $T_{MAX}$ and the minimum $T_{MIN}$ of the range in FIG. 4 correspond to T1+δT and T1-δT, respectively, where δT is a width of the convergent temperature range. When the temperature monitoring signal M1 is out of the preset range, the operation backs to step S101 as following the path LOOP1, while the monitoring signal M1 is within the preset range, the operation advances to step S104. At step S104, the counter 33 counts the clock CLK during the counter enable signal $SC_{ENABLE}$ is asserted. When the count by the count 33 is below the standard time REF corresponding to the preset period $T_{REF}$, the operation backs to step S102 as following the path LOOP2. On the other hand, the count by the counter 33 exceeds the standard time REF, the operation advances to step S105.

Practically, the temperature of the LD 13 shows overshoots and undershoots as shown in FIG. 4A, due to the instability of the feedback loop comprised of the temperature sensor 25, the TEC driver 19, and the TEC 17, mainly derived from the large time constant of the feedback loop. Thus, the temperature of the LD 13 may be stabilized as showing these undershoots and overshoots as relaxing the magnitude thereof. The master controller 21 iterates the paths LOOP1 and LOOP2 in the flow chart shown in FIG. 3 until the temperature monitoring signal enters within convergent range, and finally outputs the driver enable signal $SD_{ENABLE}$ at t8.

When the error signal $S_{ERROR}$ stays in the convergent range $S_{RANGE}$ for about 0.4 seconds, it is practically confirmed that the temperature of the LD 13 does not show such overshoots and undershoots to exceed the convergent range $S_{RANGE}$. In this case, setting the clock frequency is 200 Hz, which is equivalent to the period of 5 milliseconds, the driver controller 37 outputs, when the counter counts 80 clocks, the driver enable signal $SD_{ENABLE}$ regarding the temperature of the LD becomes stable. Moreover, the temperature convergent range is preferable to be ±3° C. because the emitting wavelength of the LD 13 fluctuates by ±0.3 nm when the temperature thereof varies within this convergent range.

FIGS. 5A to 5D show the behavior of the emission wavelength of the LD 13 when the temperature thereof is set to be a value denoted in the figure, -5° C., 40° C., 50° C., and 65° C., respectively. The vertical axis denotes the emission wavelength of the LD, while the horizontal axis denotes the time from the optical transmitter is powered on. The range between two dotted lines in each figure corresponds to the convergent range in terms of the wavelength. The time $T_{OP}$, since the emission wavelength first enters the convergent range after the transmitter is powered on through strays away from the range, depends on the temperature Ta of the LD, and is 0.4 milliseconds (ms) in the maximum when the temperature Ta thereof is 65° C. Accordingly, be setting the standard period $T_{REF}$, by which the temperature of the LD becomes stable, to be 0.4 milliseconds, the optical transmitter may operate the LD within the range of the temperature from -5° C. to 65° C. after the temperature thereof becomes stable, which prevents to appear the undershoot or the overshoot in the emission wavelength thereof.

Second Embodiment

Figure 6:
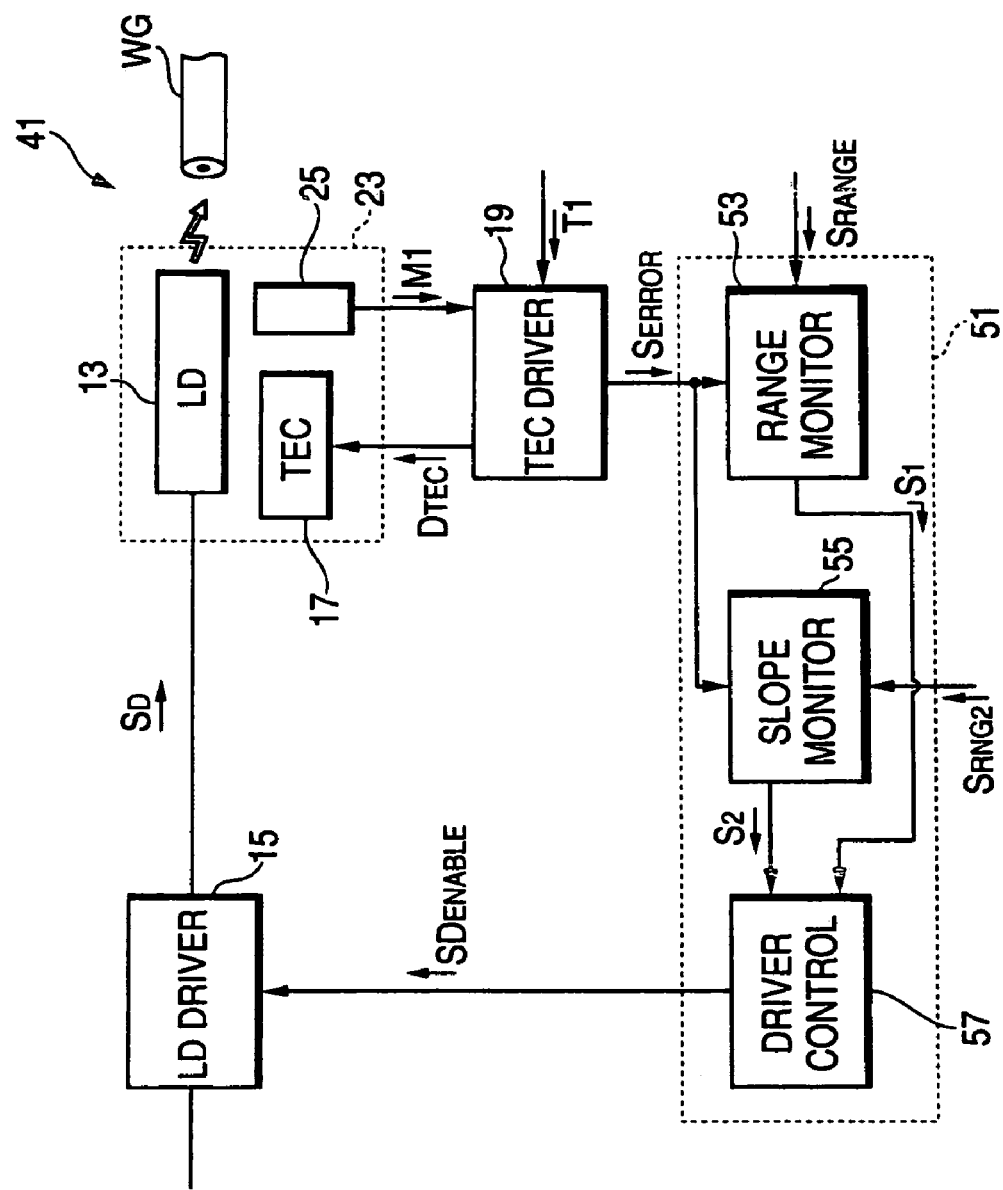
FIG. 6 is another block diagram of the optical transmitter according to the second embodiment of the invention.

FIG. 6 is another block diagram of the optical transmitter according to the present invention. This transmitter 41 provides a master controller 51 different to that provided in the first embodiment shown in FIG. 1.

The master controller 51 comprises a range monitor 53, a slope monitor and a driver controller 57. The range monitor 53, by receiving a first range signal $S_{RANGE1}$ and the error signal $S_{ERROR}$ from the TEC driver 19, outputs a first signal S1 to the driver controller 57 when the error signal $S_{ERROR}$ is within the first convergent range $S_{RANGE1}$. The slope monitor 55, by receiving a second range signal $S_{RANGE2}$ and the error signal $S_{ERROR}$, determines the slope of the error signal $S_{ERROR}$ against the time and outputs a second signal S2 to the driver controller 57 when the slope of the error signal $S_{ERROR}$ is within the second range signal $S_{RANGE2}$. The driver controller 57, by receiving the first signal S1 from the range monitor 53 and the second signal S2 from the slope monitor 55, outputs the driver enable signal $SD_{ENABLE}$ to the LD-Driver 15.

Figure 7:
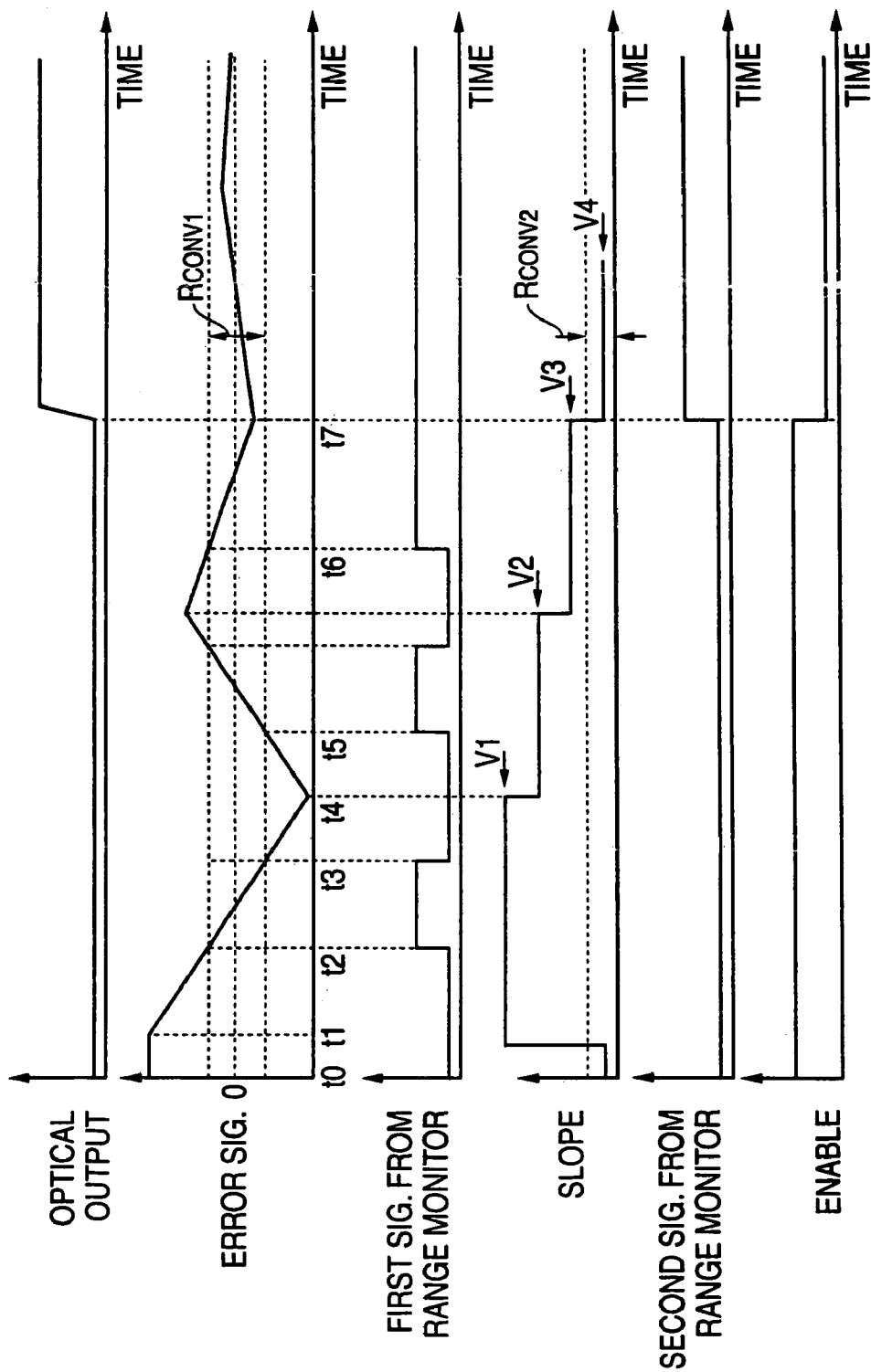
FIG. 7 is a time chart of the optical output, the error signal $S_{ERROR}$, the first signal S1 from the range monitor, the slope of the error signal $SC_{ERROR}$, the second signal S2 from the slope monitor, and the driver enable signal $SD_{ENABLE}$, for the optical transmitter according to the second embodiment.

Next, the operation of the second optical transmitter will be described as referring to FIG. 7. In FIG. 7, the behaviors of the optical output, the error signal, the first signal, the slope of the error signal, the second signal, and the driver enable signal are illustrated.

The optical transmitter 41 is powered on, or is reset at t0. Since t1 through t2, the error signal $S_{ERROR}$ is greater than the upper limit of the first convergent range $R_{CONV1}$, which is equivalent to the first range signal $S_{RANGE1}$, and the range monitor 53 sets the first signal S1 to the low level, which denotes the first signal S1 is out of the first convergent range $R_{CONV1}$. The slope monitor 55, determining the slope of the error signal $S_{ERROR}$, sets the second signal S2 to the low level since the slope thereof is V1, which is out of the second convergent range $R_{CONV2}$ corresponding to the second range signal.

The slope D of the error signal $S_{ERROR}$ is obtained, for example, as follows:

$$D(n)=(S_{ERROR}(n)-S_{ERROR}(n-1))/t,$$

where $S_{ERROR}(N)$ denotes the present error signal $S_{ERROR}$, while $S_{ERROR}(N-1)$ denotes the previous error signal $S_{ERROR}$ stored in the memory, and t is a time from the previous monitoring to the current monitoring. In the procedure subsequently to the determination of the slope, an absolute value of D(n) will be used.

Since t2 through t3, the error signal is within the first convergent range $R_{CONV1}$, and the range monitor 53 sets the first signal S1 to the high level, while the slope monitor 55 leaves the second signal to the low level because the slope of the error signal $S_{ERROR}$ is left to the value V1, which is out of the second convergent range $R_{CONV2}$. Further, the driver enable signal $SD_{ENABLE}$ is kept in the disable state.

The error signal $S_{ERROR}$ is out of the first convergent range $R_{CONV1}$ and the slope thereof is also out of the second convergent range $R_{CONV2}$, the first and second signals, S1 and S2, are both negated since t3 through t4. Subsequently to t4 through t5, although the slop of the error signal changes to a value V2, which is smaller than the previous value V1, the value V2 is still out of the second convergent range $R_{CONV2}$. Consequently, the second signal S2 is left negated.

As iterating the state described above, the TEC driver 19 stabilizes the temperature of the LD, and finally at t6, the error signal $S_{ERROR}$ is within the first convergent range $R_{CONV1}$, in which the range monitor 53 sets the first signal to the high level. However, the slope of the error signal $S_{ERROR}$ shows the value V3, which is smaller than the value V2 but still out of the second convergent range $R_{CONV2}$ for to keep the second signal S2 to the low level by the slope monitor 55.

Further stabilizing the temperature of the LD 13, the error signal $S_{ERROR}$ is within the first convergent range $R_{CONV1}$, and the slope thereof becomes a value V4 within the second convergent range $R_{CONV2}$ for the slope monitor to set the second signal S2 to the high level. Finally, the driver controller 57, by receiving the change for the first and second signal to the high level, outputs the driver enable signal $SD_{ENABLE}$ to the LD-Driver 15 and the LD-Driver 15 starts to drive the LD 13.

While particular embodiments of the invention have been described and illustrated it will be apparent to one skilled in the art that numerous changes can be made to the basic concept. It is to be understood that such changes will fall within the full scope of the invention as defined by the appended claims.

What is claimed is:

1. An optical transmitter, comprising:
   a laser diode;
   a laser driver for driving the laser diode;
   a thermoelectric controller for controlling a temperature of the laser diode;
   a TEC driver for driving the thermoelectric controller by receiving a temperature monitor signal corresponding to the temperature of the laser diode and a target signal corresponding to the target temperature of the laser diode, the TEC driver outputting an error signal corresponding to a difference between the temperature monitor signal and the target signal; and
   a master controller, by receiving the error signal output from the TEC driver, for generating a driver enable signal to enable the laser driver when the error signal output from the TEC driver is within a first convergent range and a rate of change of the error signal is within a second convergent range,
   wherein the master controller includes a range monitor, a slope monitor, a driver controller, and a memory, the range monitor enabling a first signal when the error signal output from the TEC driver is within the first convergent range and outputting the first signal to the driver controller, the slope monitor enabling a second signal when the rate of change of the error signal is within the second convergent range and outputting the second signal to the driver controller, the driver controller outputting the driver enable signal when the first signal and the second signal are both enabled, the memory storing an error signal previously compared by the TEC driver, and
   wherein the slope monitor calculates the rate of the change of the error signal by subtracting the error signal currently input from the TEC driver from the error signal previously input and stored in the memory.

2. A method for controlling an optical transmitter comprising a laser diode, a laser driver for driving the laser diode, a thermoelectric controller for controlling a temperature of the laser diode, a TEC driver for driving the thermoelectric controller, and a master controller including a range monitor, a slope monitor, a driver controller and a memory, the method comprising steps of:
   monitoring the temperature of the laser diode by a temperature sensor disposed close to the laser diode;
   comparing the monitored temperature with a target temperature and outputting an error signal to the master controller by the TEC driver, the error signal corresponding to a difference between the monitored temperature and the target temperature;
   deciding, by the master controller, whether the error signal is within a first convergent range and whether a rate of change of the error signal is within a second convergent range; and
   enabling a driver enable signal to enable the laser driver when a first condition that the error signal is within the first convergent range and a second condition that the rate of change of the error signal is within the second convergent range are both satisfied,
   wherein the step of enabling the driver enable signal includes steps of,
   enabling a first signal by the range monitor to the driver controller when the first condition is satisfied,
   enabling a second signal by the slope monitor to the driver controller when the second condition is satisfied, wherein said step of enabling the second signal includes the steps of,
   inputting the current error signal from the TEC driver, reading the previous error signal stored in the memory,
   subtracting the previous error signal from the current error signal, and
   comparing a subtracted result with the second convergent range, and
   outputting the driver enable signal by the driver controller when the driver controller receives both the first signal and the second signal.

* * * * *